United States Patent [19]

Morita

[11] Patent Number: 5,148,258
[45] Date of Patent: Sep. 15, 1992

[54] SEMICONDUCTOR DEVICE HAVING JUNCTION STRUCTURE OF A PLURALITY OF ELEMENT ISOLATION REGIONS

[75] Inventor: Shigeru Morita, Kawasaki, Japan

[73] Assignee: Kabushiki Kaisha Toshiba, Kawasaki, Japan

[21] Appl. No.: 633,801

[22] Filed: Dec. 26, 1990

[30] Foreign Application Priority Data

Dec. 27, 1989 [JP] Japan .................................. 1-336657

[51] Int. Cl.⁵ .................... H01L 27/12; H01L 27/02; H01L 29/06
[52] U.S. Cl. ....................................... 357/49; 357/47; 357/55
[58] Field of Search .............................. 357/49, 47, 55

[56] References Cited

U.S. PATENT DOCUMENTS 4,929,992  5/1990  Thomas et al. ........................ 357/49

*Primary Examiner*—Mark V. Prenty
*Attorney, Agent, or Firm*—Finnegan, Henderson, Farabow, Garrett and Dunner

[57] ABSTRACT

This invention relates to a junction structure in which element isolation regions having different shapes (e.g., isolation regions respectively formed by a trench isolation method and a LOCOS method) for electrically isolating an element region formed on a semiconductor substrate are bonded to each other. A LOCOS isolation region made of an insulator for electrically isolating many circuit elements of an element region formed on a semiconductor substrate is formed. An end portion of the insulating trench isolation region bonded to the LOCOS isolation region is formed to have a sectorial shape. When a side serving as an end portion of the LOCOS isolation region is bonded to tapered sides of the sectorial portion of the trench isolation region to cause the tapered sides to cross and overlap each other, an included angle serving as an angle defined by these isolation regions on the element region is an obtuse angle.

19 Claims, 4 Drawing Sheets

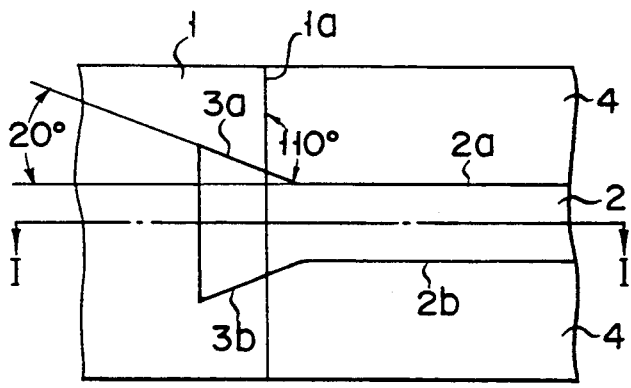
FIG. 1A
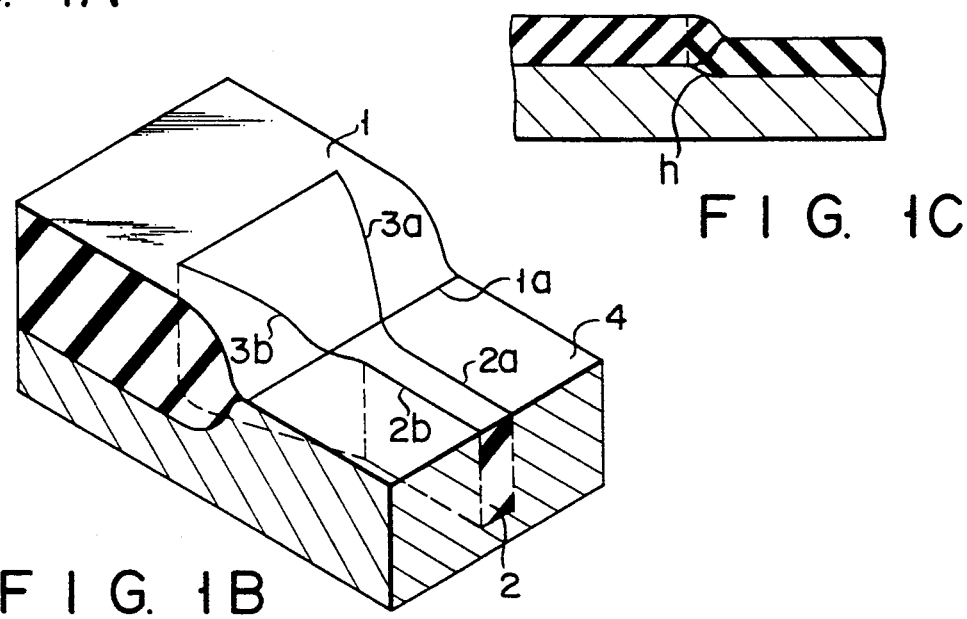
FIG. 1C
FIG. 1B
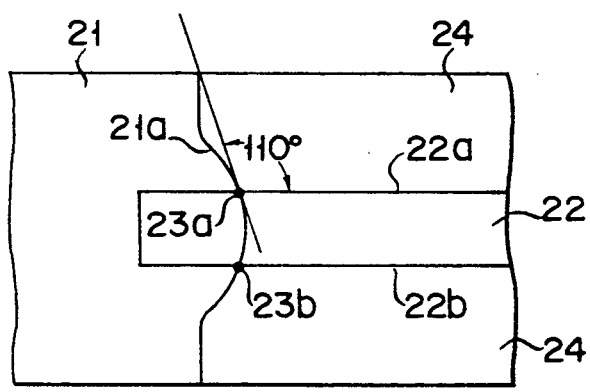
FIG. 2A

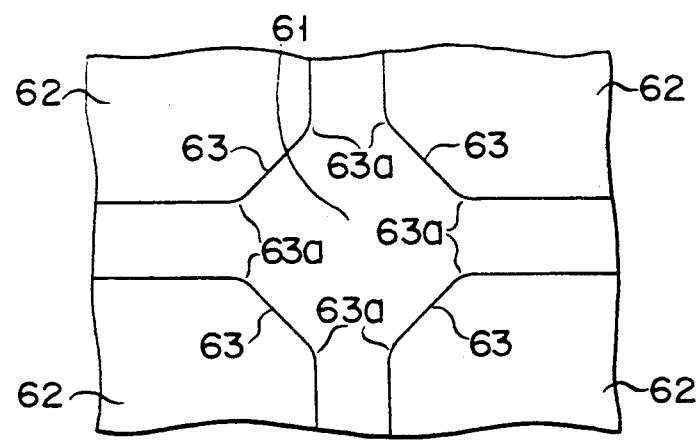
F I G. 6
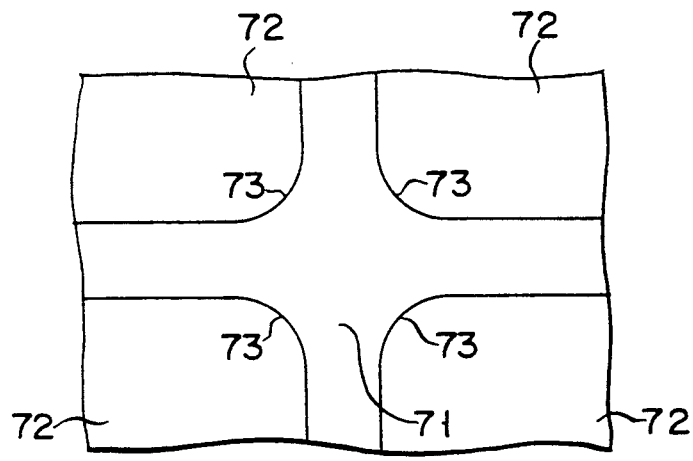
F I G. 7
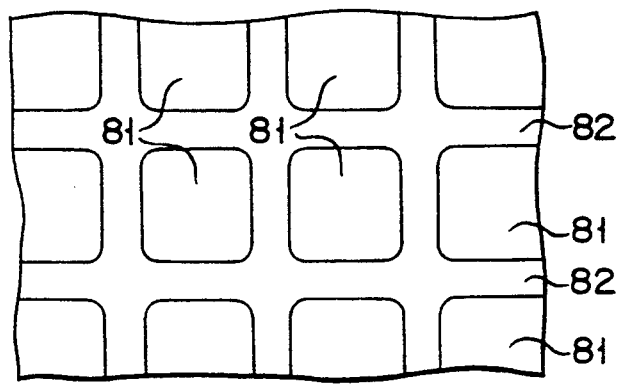
F I G. 8

SEMICONDUCTOR DEVICE HAVING JUNCTION STRUCTURE OF A PLURALITY OF ELEMENT ISOLATION REGIONS

BACKGROUND OF THE INVENTION

1. Field of the Invention

The present invention relates to a semiconductor device having element isolation regions and, more particularly, to a semiconductor device having an improved junction structure of element isolation regions having different shapes.

2. Description of the Related Art

In general, when a plurality of circuit elements are to be formed on the major surface of a semiconductor device, the circuit elements must be electrically isolated from each other. As representative element isolation techniques used in this case, there are local oxidation of the silicon (LOCOS) and trench isolation. An insulation structure is formed by a method obtained by combining these techniques.

An element isolation layer made of an insulator and formed by the LOCOS method to electrically isolate an element region is a relatively wide element isolation layer and can isolate an element region having a wide area. In particular, according to the LOCOS method, an element isolation layer having highly reliable electric isolation can be easily formed.

The trench isolation method is performed as follows. A trench is formed in the surface of a semiconductor substrate using anisotropic etching or the like, and the trench is filled with an insulator to form a trench insulating layer, thereby isolating an element region.

According to the trench isolation method, a fine element isolation region which cannot be obtained by the LOCOS method can be formed.

That is, when the LOCOS method and the trench isolation method are used at the same time, a fine element isolation region and a wide element isolation region can be easily combined to be formed.

However, a junction portion of element isolation regions having different shapes and consisting of a fine element isolation region and a wide element isolation region in a semiconductor integrated circuit is present between these element isolation regions. It is almost impossible to prevent formation of the junction portion by a pattern layout. On the contrary, when the junction portion is provided, the pattern layout can be easily designed.

When a pattern layout obtained by perpendicularly bonding the trench element isolation region to the LOCOS element isolation region is employed in a junction portion of these element isolation regions, electric isolation must be assured. Therefore, both the element isolation regions are formed to overlap each other.

A structure at the overlapping portion is more complex than an isolation structure formed by a single element isolation region consisting of, e.g., a LOCOS element isolation region. In addition, since stress generated by thermal expansion or the like in the step of forming an element isolation region is easily concentrated on an overlapping portion between an element region and an element isolation region in a semiconductor substrate, crystal defects may occur in the semiconductor substrate near the junction portion depending on a shape of the junction portion.

When an impurity is to be diffused in self-alignment in an element region using the element isolation region as a mask to form an impurity diffusion layer, a voltage is applied to the substrate during diffusion to generate an electric field at a corner of the diffusion layer. The electric field is concentrated on a specific portion due to the shape of an overlapping portion of the element isolation regions. Therefore, breakdown voltage characteristics are conspicuously degraded, and a junction breakdown voltage is decreased.

That is, according to the above conventional junction structure, occurrence of crystal defects in a semiconductor substrate near the junction portion is encouraged in the step of forming an element isolation region, and a junction breakdown voltage is decreased compared with a junction structure consisting of the same element isolation region.

SUMMARY OF THE INVENTION

It is, therefore, an object of the present invention to provide a semiconductor device having a junction structure of element isolation region for suppressing occurrence of crystal defects in a semiconductor substrate near a junction portion between element isolation regions having different shapes and consisting of a LOCOS element isolation region and a trench element isolation region and for increasing a junction breakdown voltage of an impurity diffusion layer contacting the junction portion.

According to the first aspect of the present invention, there is provided a semiconductor device having a junction structure of element isolation regions of different shapes comprising an element region formed on a major surface of a semiconductor substrate, a first element isolation region formed to electrically isolate the element region, and a second element isolation region formed to electrically isolate the element region and to have finer patterning than the first element isolation region and a junction structure with the first element isolation region, the junction structure being obtained so that an included angle defined by a junction point on the element region between one side serving as an end portion of the first element isolation region and each of sides of end portions of the second element isolation region which crosses the one side is an obtuse angle.

According to the second aspect of the present invention, there is provided a semiconductor device having a junction structure of element isolation regions of different shapes comprising an element region formed on a major surface of a semiconductor substrate, a first element isolation region which electrically isolates the element region and a side of which is curved to be projected to the element region, and a second element isolation region formed to electrically isolate the element region and to have finer patterning than the first element isolation region and a junction structure with the first element isolation region, the junction structure being obtained so that an included angle defined by a junction point on the element region between one side serving as an end portion of the first element isolation region and each of sides of end portions of the second element isolation region which crosses the one side is an obtuse angle.

According to the third embodiment of the present invention, there is provided a semiconductor device having a junction structure of element isolation regions of different shapes comprising an element region formed on a major surface of a semiconductor substrate, a first element isolation region formed to electrically isolate the element region, and a second element isolation region, an end portion of which has a circular shape, formed to electrically isolate the element region and to have finer patterning than the first element isolation region and a junction structure with the first element isolation region, the junction structure being obtained so that an included angle defined by a junction point on the element region between one side serving as an end portion of the first element isolation region and a circular end portion of the second element isolation region which crosses the one side is an obtuse angle.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a plan view showing a junction portion of element isolation regions having different shapes in a semiconductor device according to the first embodiment of the present invention;

FIG. 1B is a perspective view showing the junction portion of the element regions of different shapes in FIG. 1A;

FIG. 1C is a view showing a sectional structure of the junction portion of the element isolation regions having different shapes;

FIG. 2A is a plan view showing a sectional structure of a junction portion of element isolation regions having different shapes in a semiconductor device according to the second embodiment of the present invention;

FIG. 6 is a plan view showing a junction portion where trench element isolation regions are bonded to each other in a semiconductor device according to the sixth embodiment of the present invention;

FIG. 7 is a plan view showing a junction portion where trench element isolation regions are bonded to each other in a semiconductor device according to the seventh embodiment of the present invention; and FIG. 8 is a view showing an arrangement for isolating an element region in a matrix arrangement by the trench element isolation region in the semiconductor device according to the sixth and seventh embodiments of the present invention.

DETAILED DESCRIPTION OF THE PREFERRED EMBODIMENTS

Figure 2B:
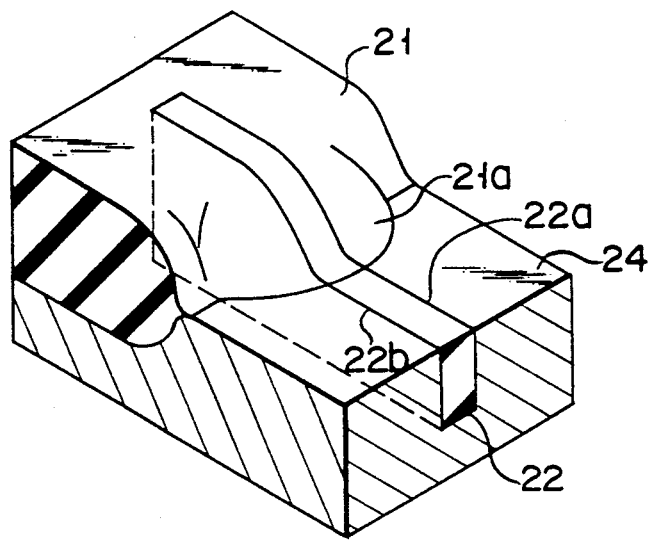
FIG. 2B is a perspective view showing the junction portion of the element isolation regions having different shapes in FIG. 2A.

The present invention will be described below with reference to the accompanying drawings.

FIG. 1A shows, as the first embodiment, a portion where a second element isolation region (to be referred to as a trench element isolation region hereinafter) having a small area and formed by, e.g., a trench isolation method is bonded to a first element isolation region (to be referred to as a LOCOS element isolation region hereinafter) 1 formed by, e.g., a LOCOS method and having a large area in an IC formed on a major surface of a semiconductor substrate. That is, FIG. 1A shows a part of a junction structure of element isolation regions having different shapes. FIG. 1B is a perspective view showing the section of the junction structure viewed from the upper oblique direction. FIG. 1C is a sectional view showing a sectional structure of the element isolation regions having different shapes taken along a line I—I in FIG. 1A.

In FIG. 1A, an end portion of the trench element isolation region 2 bonded to the LOCOS element isolation region 1 is formed as sectorial tapers 3a and 3b each having a taper angle of 20° with respect to each of sides 2a and 2b of the trench element isolation region 2. The taper 3a of the trench element isolation region 2 is bonded to a straight side 1a to overlap the side 2a of the element isolation region 2 and the straight side 1a of the LOCOS element isolation region 1 perpendicular to the side 2a of the trench element isolation region, and the taper 3b of the trench element isolation region 2 is bonded in the same manner as described above.

The tapers 3a and 3b of the trench element isolation region 2 and the straight side 1a of the LOCOS element isolation region 1 are bonded to each other to have an obtuse angle of, e.g., 110° on an element region 4.

As shown in the sectional view in FIG. 1C, the bottom portion h of a junction portion between the LOCOS element isolation region 1 and the trench element isolation region 2 is desired to be smoothly changed without a gap or step difference.

FIG. 2A shows, as the second embodiment, a portion where a second element isolation region (to be referred to as a trench element isolation region hereinafter) 22 having a small area and formed by, e.g., a trench isolation method is bonded to a first element isolation region (to be referred to as a LOCOS element isolation region hereinafter) 21 formed by, e.g., a LOCOS method and having a large area in an IC formed on a major surface of a semiconductor substrate. That is, FIG. 2A shows a part of a junction structure of element isolation regions having different shapes. FIG. 2B is a perspective view showing the section of the junction structure viewed from the upper oblique direction.

That is, a side of the LOCOS element isolation region 21 is formed to be curved to form a convex portion 21a, and both sides 22a and 22b of the rectangular end portion of the trench element isolation region 22 are bonded to the convex portion 21a to overlap.

The convex portion 21a is formed such that a tangent to the convex portion at a junction portion 23a where the convex portion 21a crosses the side 22a of the end portion is bonded to the side 22a of the end portion to obliquely cross the side 22a on an element region 24 at an angle of, e.g., 110°. In addition, the side 22b of the end portion is bonded to the convex portion 21a in the same manner as described above.

Figure 3A:
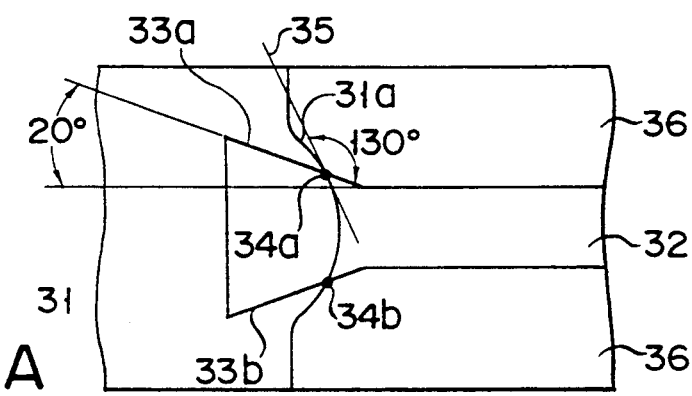
FIG. 3A is a plan view showing a sectional structure of a junction portion of element isolation regions having different shapes in a semiconductor device according to the third embodiment of the present invention.
Figure 3B:
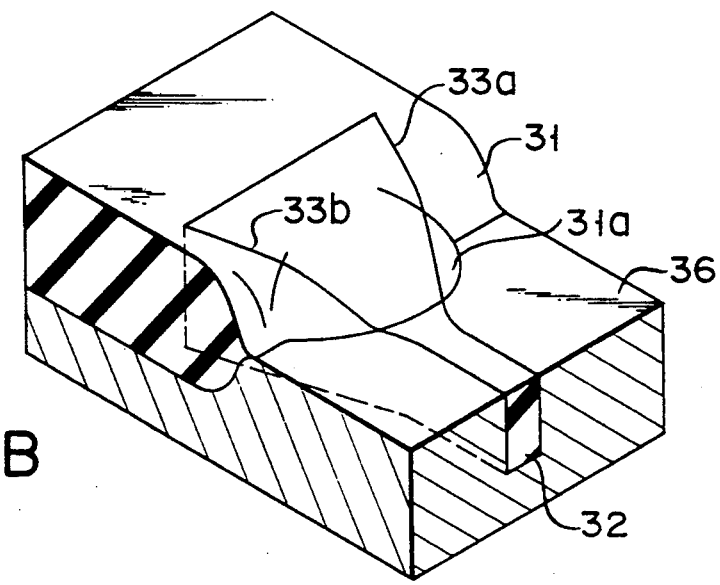
FIG. 3B is a perspective view showing the junction portion of the element isolation regions having different shapes in FIG. 3A.

FIG. 3A shows, as the third embodiment, a portion where a second element isolation region (to be referred to as a trench element isolation region hereinafter) 32 having a small area and formed by, e.g., a trench isolation method is bonded to a first element isolation region (to be referred to as a LOCOS element isolation region hereinafter) 31 formed by, e.g., a LOCOS method and having a large area in an IC formed on a major surface of a semiconductor substrate. That is, FIG. 3A shows a part of a junction structure of element isolation regions having different shapes. FIG. 3B is a perspective view showing the section of the junction structure viewed from the upper oblique direction.

A structure according to the third embodiment is as follows. A convex portion 31a obtained by curving a side of the LOCOS element isolation region 31 in the same convex shape as the second embodiment is bonded to overlap tapers 33a and 33b each end portion of which is formed in the same sectorial shape as the trench element isolation region of the first embodiment.

That is, in an end portion of the trench element isolation region 32, the sectorial tapers 33a and 33b each having a taper angle of, e.g., 20° with respect to the sides of the element isolation region 32 are formed.

The convex portion 31a is formed such that a tangent 35 to the convex portion at a junction point 34a causing the convex portion 31a to cross the taper 33a is bonded to obliquely cross the taper 33a at an angle of, e.g., 130°. In addition, the taper 33b is bonded to the convex portion 31a in the same manner as described above.

Therefore, at the junction point between the LOCOS element isolation region and the trench element isolation region, an included angle defined by both the crossing sides of each end portion of these element regions is an obtuse angle.

In this embodiment, a junction is obtained by combining the LOCOS element isolation region having a convex portion and the trench element isolation region having a sectorial taper at the end portion of the trench element isolation region. However, the present invention is not limited to this shape.

Figure 4:
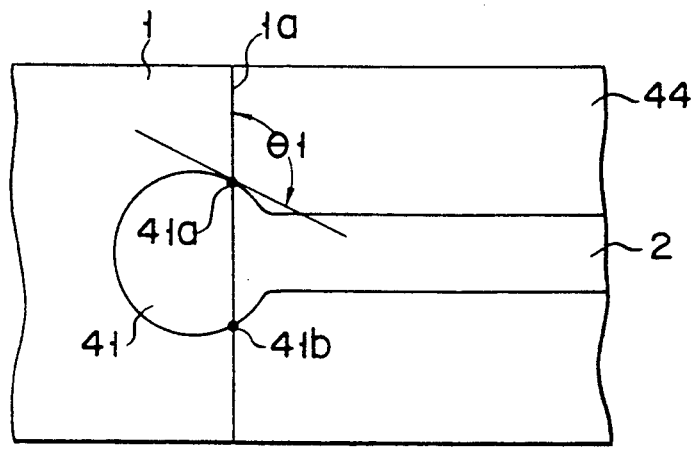
FIG. 4 is a plan view showing a sectional structure of a junction portion of element isolation regions having different shapes in a semiconductor device according to the fourth embodiment of the present invention.
Figure 5:
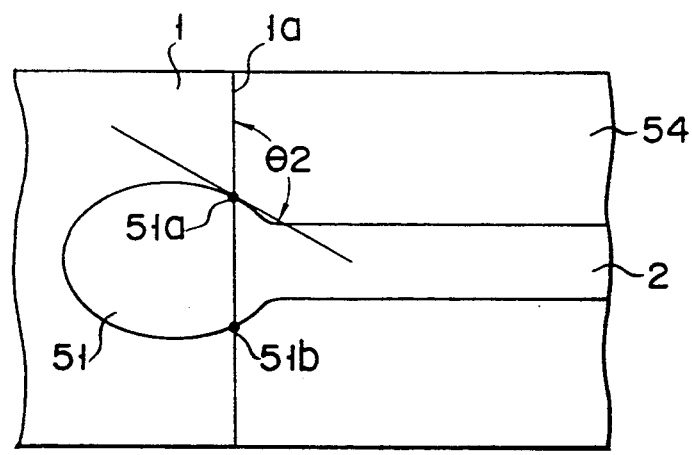
FIG. 5 is a plan view showing a sectional structure of a junction portion of element isolation regions having different shapes in a semiconductor device according to the fifth embodiment of the present invention.

As shown in FIG. 4, an end portion of a trench element isolation region at a junction portion may have a circular shape. As shown in FIG. 5, an end portion of a trench element isolation region at a junction portion may have an oval shape. In these cases, since the same parts as in FIG. 1A are used in FIGS. 4 and 5, the same reference numerals as in FIG. 1A denote the same parts in FIGS. 4 and 5.

An end portion 41 of a trench element isolation region 2 shown in FIG. 4 is formed to have a circular shape, and the trench element isolation region 2 is bonded to a LOCOS element isolation region 1 such that an included angle defined by causing points 41a and 41b of the end portion 41 to cross the LOCOS element isolation region 1 on a element region 44 is an obtuse angle $\theta 1$.

An end portion 51 of a trench element isolation region 2 shown in FIG. 5 is formed to have an oval shape, and the trench element isolation region 2 is bonded to a LOCOS element isolation region 1 such that an included angle defined by causing points 51a and 51b of the end portion 51 to cross the LOCOS element isolation region 1 on an element region 54 is an obtuse angle $\theta 2$.

As described above, according to the preferred embodiments of the present invention, stress generated depending on shapes of element isolation regions at a junction point therebetween can be moderated compared with stress generated when sides of conventional element isolation regions perpendicularly cross each other. As a result, crystal defects which occur in an element region can be moderated.

In addition, in the sequential element forming step, ion implantation is performed using the LOCOS element isolation region and the trench element isolation region as masks to form a MOS transistor. When a voltage is applied to an impurity diffusion layer represented by a source/drain of the MOS transistor, electric field concentration near the junction portion is moderated. Therefore, a decrease in junction breakdown voltage can be suppressed.

In the above embodiments, a LOCOS element isolation region and a trench element isolation region are bonded to each other. However, the present invention can be applied to a case wherein trench element regions are bonded to each other.

FIGS. 6 and 7 are views showing a junction portion where trench element isolation regions according to the sixth and seventh embodiments of the present invention are bonded to each other.

Concerning this junction, according to conventional junction structure, element isolation regions are almost perpendicularly bonded to each other, and a junction shape is not considered at all. In this junction structure, crystal defects occur in a semiconductor substrate near the junction portion, and a junction breakdown voltage of an impurity diffusion layer contacting the junction portion is decreased.

For this reason, the trench element isolation regions are formed such that the junction point therebetween has an obtuse angle between these regions.

Therefore, according to the sixth embodiment shown in FIG. 6, a trench element isolation region 64 is formed such that each corner portion of circuit element regions 62 contacting a junction portion 61 has a chamfer 63.

That is, a structure in which each of junction portions 63a has an obtuse angle is used.

According to the seventh embodiment shown in FIG. 7, a trench element isolation region 74 is formed such that each corner portion 73 of circuit element regions 72 contacting a junction portion 71 has a circular shape.

By using the above junction structure of a trench element isolation region, a required arbitrary arrangement pattern can be employed. For example, as shown in FIG. 8, element regions 81 can be arranged in a matrix by a trench element isolation region 82.

As described above, according to a junction structure of element isolation regions, a junction portion between the LOCOS element isolation region and the trench element isolation region or a junction portion between the trench element isolation regions is formed to have an obtuse angle between these regions. Therefore, there can be provided a junction structure of an element isolation region capable of suppressing crystal defects which occur in a semiconductor substrate near the junction portion and of increasing a junction breakdown voltage of an impurity diffusion layer contacting the junction point.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   an element region on a major surface of a semiconductor substrate,
   a first element isolation region; and
   a second element isolation region for electrically isolating said element region, having a side exposed to the element region, and defining an obtuse angle, in a plane parallel to the major surface, between a first side of said first element isolation region and each side of said second element isolation region that crosses the first side.

2. A semiconductor device according to claim 1, wherein said first element isolation region is a LOCOS element isolation region, and said second element isolation region is a trench element isolation region.

3. A semiconductor device according to claim 2, wherein a junction portion between a bottom of said LOCOS element isolation region and a bottom of said trench element isolation region has a smooth, non-step, shape.

4. A semiconductor device according to claim 1, wherein said first element isolation region and said second element isolation region have a trench element isolation structure.

5. A semiconductor device according to claim 2, further including a plurality of element regions electrically isolated by a trench element isolation region in a matrix arrangement.

6. A semiconductor device comprising:
   an element region on a major surface of a semiconductor substrate;
   a first element isolation region, having a convex side; and
   a second element isolation region for electrically isolating said element region, having a side exposed to the element region, and defining an obtuse angle, in a plane parallel to the major surface, between the convex side and each side of said second element isolation region that crosses the convex side.

7. A semiconductor device according to claim 6, wherein said first element isolation region is a LOCOS element isolation region, and said second element isolation region is a trench element isolation region.

8. A semiconductor device according to claim 7, wherein a junction portion between a bottom of said LOCOS element isolation region and a bottom of said trench element isolation region has a smooth, non-step, shape.

9. A semiconductor device according to claim 7, wherein said first element isolation region and said second element isolation region have a a trench isolation structure.

10. A semiconductor device according to claim 9, further including a plurality of element regions electrically isolated by a trench element isolation region in a matrix arrangement.

11. A semiconductor device comprising:
    an element region formed on a major surface of a semiconductor substrate;
    a first element isolation region; and
    a second element isolation region for electrically isolating said element region, having a side exposed to the element region and an elliptically shaped end having at least one part, and defining an obtuse angle, in a plane parallel to the major surface, between a first side of said first element isolation region and each part of said elliptically shaped end that crosses the first side.

12. A semiconductor device according to claim 11, wherein said first element isolation region is a LOCOS element isolation region, and said second element isolation region is a trench element isolation region.

13. A semiconductor device according to claim 12, wherein a junction portion between a bottom of said LOCOS element isolation region and a bottom of said trench element isolation region has a smooth, non-step, shape.

14. A semiconductor device according to claim 11, wherein said first element isolation region and said second element isolation region have a a trench isolation structure.

15. A semiconductor device according to claim 12, further including a plurality of element regions electrically isolated by a trench element isolation region in a matrix arrangement.

16. The semiconductor device of claim 11, wherein the elliptically shaped end has a circular shape.

17. The semiconductor device of claim 1, wherein the first element isolation region has a strip shape, and a patterning of the second element isolation region is finer than a patterning of the first element isolation region.

18. The semiconductor device of claim 6, wherein a patterning of the second element isolation region is finer than a patterning of the first element isolation region.

19. The semiconductor device of claim 11, wherein the first element isolation region has a strip shape, and a patterning of the second element isolation region is finer than a patterning of the first element isolation region.

* * * * *